(12) United States Patent
Banerjee et al.

(10) Patent No.: US 12,727,408 B2
(45) Date of Patent: Sep. 1, 2026

(54) LARGE-AREA WAFER-SCALE CMOS-COMPATIBLE 2D-MATERIAL INTERCALATION DOPING TOOLS, PROCESSES, AND METHODS, INCLUDING DOPING OF SYNTHESIZED GRAPHENE

(71) Applicant: Destination 2D Inc., Milpitas, CA (US)

(72) Inventors: Kaustav Banerjee, Goleta, CA (US); Ravi Iyengar, Milpitas, CA (US); Satish Sundar, San Jose, CA (US)

(73) Assignee: Destination 2D, Inc., San Jose, CA (US)

( * ) Notice: Subject to any disclaimer, the term of this patent is extended or adjusted under 35 U.S.C. 154(b) by 18 days.

(21) Appl. No.: 18/527,043

(22) Filed: Dec. 1, 2023

(65) Prior Publication Data

US 2024/0258118 A1 Aug. 1, 2024

Related U.S. Application Data

(60) Provisional application No. 63/441,766, filed on Jan. 27, 2023.

(51) Int. Cl.
*H10P 32/12* (2026.01)
*H01J 37/317* (2006.01)
(Continued)

(52) U.S. Cl.
CPC .......... *H10P 32/12* (2026.01); *H01J 37/3171* (2013.01); *H01J 37/32816* (2013.01); *H10P 32/17* (2026.01)

(58) Field of Classification Search
CPC ................ H01L 21/383; H01J 37/3171; H01J 37/32816
See application file for complete search history.

(56) References Cited

U.S. PATENT DOCUMENTS 3,205,102 A 9/1965 McCaldin
3,558,376 A 1/1971 Schmidt
(Continued)

FOREIGN PATENT DOCUMENTS

CN 104047060 A 9/2014
CN 106011779 A 10/2016
(Continued)

OTHER PUBLICATIONS ip.com word and data search done. (Year: 2026).*
(Continued)

*Primary Examiner* — Zandra V Smith
*Assistant Examiner* — Andre C Stevenson
(74) *Attorney, Agent, or Firm* — Greer, Burns & Crain, Ltd.; Steven P. Fallon

(57) ABSTRACT

An intercalation doping apparatus including: a reactor chamber where single or multiple wafers or substrates (SoMWoSubs) are disposed within the reactor chamber, where SoMWoSubs have a diameter or a side distance from 25 mm to 450 mm; a heater, where the heater is configured to provide heat to the SoMWoSubs disposed within the reactor chamber, where the SoMWoSubs include a temperature from 25° C. to 500° C.; where pressure is applied to at least one surface of the SoMWoSubs disposed within the reactor chamber within a range of 2 bar to 500 bar; and a dopant application apparatus, where the dopant application apparatus includes at least valves and tubing which bring dopants from outside to within the reactor chamber and includes at least a dopant crucible disposed within the reactor chamber, where the dopants include material in solid, liquid, or gaseous phase, and where the dopants include intercalation doping agents.

13 Claims, 5 Drawing Sheets

(51) Int. Cl.
*H01J 37/32* (2006.01)
*H10P 32/10* (2026.01)

(56) References Cited

U.S. PATENT DOCUMENTS

| | | | | |
|---|---|---|---|---|
| 3,804,682 | A | 4/1974 | Keller | |
| 5,709,745 | A | 1/1998 | Larkin | |
| 8,940,576 | B1 | 1/2015 | Bui et al. | |
| 10,177,227 | B1 * | 1/2019 | Yoshida | H01L 21/67742 |
| 11,840,773 | B1 * | 12/2023 | Bondokov | C30B 33/02 |
| 11,976,369 | B2 | 5/2024 | Banerjee | |
| 2003/0198754 | A1 * | 10/2003 | Xi | C23C 16/45512 156/345.33 |
| 2008/0280417 | A1 | 11/2008 | Yamazaki | |
| 2009/0309183 | A1 | 12/2009 | Yamazaki | |
| 2010/0203391 | A1 * | 8/2010 | Lopatin | H01G 11/74 977/734 |
| 2011/0143045 | A1 | 6/2011 | Veerasamy | |
| 2015/0053263 | A1 * | 2/2015 | Imamura | H01L 21/268 438/492 |
| 2015/0137377 | A1 | 5/2015 | Bao et al. | |
| 2018/0183024 | A1 * | 6/2018 | Zhamu | H01M 10/0525 |
| 2022/0371901 | A1 * | 11/2022 | Yang | C30B 29/36 |
| 2023/0007095 | A1 | 1/2023 | Adikari | |
| 2023/0008834 | A1 | 1/2023 | Banerjee | |
| 2023/0313358 | A1 | 10/2023 | Banerjee | |
| 2024/0014071 | A1 | 1/2024 | Banerjee | |
| 2024/0295018 | A1 | 9/2024 | Banerjee | |

FOREIGN PATENT DOCUMENTS

| | | | |
|---|---|---|---|
| CN | 113380697 | A | 9/2021 |
| CN | 115295403 | A | 11/2022 |
| WO | 2022129049 | A1 | 6/2022 |
| WO | 2022140026 | A2 | 6/2022 |
| WO | 2024158578 | A1 | 8/2024 |

OTHER PUBLICATIONS

International Search Report for PCT International Application No. PCT/US24/11484, mailed May 10, 2024, 2 pages.
Written Opinion of the International Search Authority for PCT International Application No. PCT/US24/11484, mailed May 10, 2024, 6 pages.
Agashiwala, et al., "Demonstration of CMOS-Compatible Multi-Level Graphene Interconnects with Metal Vias" IEEE Transactions on Electron Devices, Apr. 2021, pp. 2063-2091, vol. 68, No. 4.
Agashiwala, et al., Reliability and performance of CMOS-compatible multi-level graphene interconnects incorporating vias, 2020 IEEE International Electron Devices Meeting (IEDM) Dec. 12, 2020 Dec., pp. 31-1, vol. 68, No. 4.
He, et al., "Uniform doping of graphene close to the Dirac point by polymer-assisted assembly of molecular dopants", Nature Communications, Sep. 27, 2018, pp. 1-7, vol. 9, No. 1.
Ishikawa, et al., "Doping graphene films via chemically mediated charge transfer," Nanoscale Research Letters, Dec. 2011, pp. 1-5, vol. 6.
Jiang, et al., "All-carbon interconnect scheme integrating graphene wires and carbon-nanotube-vias," IEEE IEDM, 2017, pp. 14.3.1-14.3.4.
Jiang, et al., "CMOS-compatible doped-multilayer-graphene interconnects for next-generation VLSI," IEEE IEDM, Dec. 2018, pp. 34.5.1-34.5.4.
Jiang, et al., "Intercalation doped multilayer-graphene-nanoribbons for next generation interconnect," Nano Letters, 2017, pp. 1482-1488, vol. 17, No. 3.
Liu,. "Characterization ofFeC13 Intercalation Doped CVD Few-Layer Graphene," IEEE Electron Device Letters, Sep. 2016, pp. 1246-1249, vol. 37, No. 9.
Narendar, et al., "First Principle Study of Doped Graphene for FET Applications", Silicon, 2019, pp. 277-286, vol. 11.
Banerjee et al., U.S. Appl. No. 63/123,587, filed Dec. 10, 2020, entitled CMOS-Compatible Graphene Structures, Interconnects and Fabrication Methods.
Banerjee et al., U.S. Appl. No. 63/218,498, filed Jul. 6, 2021, entitled Wafer-Scale CMOS-Compatible Graphene Synthesis Tool.
Taiwan Patent Office, Notice of Allowance for Taiwan application No. 113101524, Nov. 5, 20224, 2 pages. (Not in English).
Taiwan Patent Office, Search Report for Taiwan application No. 113101524, Nov. 5, 20224, 2 pages. (Not in English).
International Preliminary Report on Patentability for PCT International Application No. PCT/US24/11484, mailed May 10, 2024, 7 pages.
Taiwan Patent Office, Notice of Allowance for Taiwan application No. 114104042, Apr. 13, 2025, 2 pages. (Not in English).
Taiwan Patent Office, Search Report for Taiwan application No. 114104042, Apr. 13, 2025, 2 pages. (Not in English).
Korean Office Action from the corresponding Korean Patent Application No. 10-2025-7027110, dated Jan. 14, 2026.
Chinese Office Action from the corresponding Chinese Patent Application No. 202480014396.7, dated Feb. 28, 2026.
Xu et al., "Modeling, Analysis, and Design of Graphene Nano-Ribbon Interconnects," IEEE Transactions on Electron Devices, 2009, pp. 1567-1578, vol. 56, No. 8, IEEE.
Japanese Office Action from the corresponding Japanese Patent Application No. 2025-543290, dated Feb. 24, 2026.
European Search Report from the corresponding European patent application No. 24727558.5, dated Jul. 15, 2026.

* cited by examiner

Batch/single; Dopant = solid/liquid vaporized to a gas; substrate pressurization = gaseous Partial Top View
208
Similar to Fig. 1B
108
142
146
148
150
152
154
156
157
158
132
140
230
210
204
207
214
218
212
220
202
206
260
262
231
235
200

Platen-Single/multi; Dopant = solid/liquid vaporized to a gas; substrate pressurization = gaseous

LARGE-AREA WAFER-SCALE CMOS-COMPATIBLE 2D-MATERIAL INTERCALATION DOPING TOOLS, PROCESSES, AND METHODS, INCLUDING DOPING OF SYNTHESIZED GRAPHENE

CROSS-REFERENCE OF RELATED APPLICATIONS

This application references U.S. patent application Ser. No. 17/863,232, filed on Jul. 12, 2022, and titled LOW-TEMPERATURE/BEOL-COMPATIBLE HIGHLY SCALABLE GRAPHENE SYNTHESIS TOOL; U.S. patent application Ser. No. 17/857,954, filed on 5 Jul. 2022, and titled LOW-TEMPERATURE/BEOL-COMPATIBLE HIGHLY SCALABLE GRAPHENE SYNTHESIS TOOL; and U.S. Provisional Patent Application No. 63/218,498, filed on 6 Jul. 2021, and titled WAFER-SCALE CMOS-COMPATIBLE GRAPHENE SYNTHESIS TOOL; as related applications, the entire contents of the foregoing applications are hereby incorporated by reference.

Furthermore, this application claims domestic benefit to U.S. Provisional Patent Application No. 63/441,766, filed on Jan. 27, 2023, and titled LARGE-AREA/WAFER-SCALE CMOS-COMPATIBLE 2D-MATERIAL DOPING TOOLS, PROCESSES, AND METHODS, INCLUDING DOPING OF SYNTHESIZED GRAPHENE; the entire contents of the foregoing application is hereby incorporated by reference.

BACKGROUND

In many applications, including microelectronics, often, the conductivity of atomically-thin two-dimensional (2D) layered materials including synthesized Multi-Layer-Graphene (MLG), or any layered semiconductor material (such as molybdenum disulphide ($MoS_2$) or tungsten disulphide ($WS_2$)), needs to be modulated. Typically, this involves an increase in the carrier concentration of the electrons or the holes or other charge carriers. This increase in the carrier concentration can be achieved through a process known as doping, which involves the insertion or adsorption of certain atoms or molecules into the host material that induces charge transfer between the dopants and the material, for example, MLG. In some instances, placement of the dopants into specific crystallographic sites to become electrically active or ionized (thereby creating excess electrons or holes) can also be engineered to effect doping. Sometimes the dopant may require a thermal anneal to move the dopant, for example, Arsenic (As) atoms in monocrystalline Silicon using applied thermal energy to move the As atoms from interstitial to substitutional crystal positions in the silicon. In order to integrate any MLG/layered material doping process into the CMOS technology, specialized large area (200/300/450/XXX mm) reactors need to be designed that must also operate below the current and projected Back-End-Of-Line (BEOL) thermal budget (<450° C.) and with high pressure (1-500 barr). This doping acceleration can include temperature or pressure, or a combination of both effects.

In the emerging field of atomically-thin two-dimensional (2D) materials, particularly graphene or MLG (essentially a single or multiple atomic layers of carbon atoms arranged in a hexagonal lattice) can now be directly synthesized over a desired substrate (typically a dielectric or a metal). Previously, there was a need for a transfer-step (to deposit the graphene/MLG to the desired substrate after their synthesis on a metal catalyst film) that is considered unfeasible and cost-ineffective in the mainstream electronics (or CMOS) industry due to contamination, defect/wrinkle generation, and other problems in the transferred graphene/MLG. In addition, previously the doping of the MLG or other 2D materials via conventional methods has presented many challenges. A leader in the choice for interconnect material in the future is graphene/MLG layers that must be doped to meet certain resistivity targets. These are the preferred materials in several BEOL (refers to process steps in chip manufacturing after the formation of the active devices such as transistors and diodes) applications, particularly on-chip interconnects.

Due to the geometry, for example, such as the layered structure of many 2D materials, intercalation doping may be utilized to minimize the bulk resistivity of the single or multiple stack material. Intercalation doping involves insertion of the dopant atoms/molecules through the sidewall faces of these materials via diffusion, which has been shown to make doping possible for narrow geometries (line-widths) of the 2D materials. Acceleration of such doping processes via application of temperature and/or pressure can make the doping process production-capable and inexpensive.

Doping at relatively low temperatures (<450)° C. is needed in a wide range of applications covering microelectronics, optoelectronics, bioelectronics, quantum computing, antennas (5G/6G/THz) and many more. However, enabling such doping; particularly over large "wafer-scale" (e.g., 200 mm, 300 mm, 450 mm, etc.) substrates, and within reasonable time scales, requires design and fabrication of a novel apparatus that can allow uniform application of a wide range of temperatures and pressures over the entire surface area of the semiconductor wafer or other substrates. A core component of such an apparatus is a reactor that is not only capable of hosting such large area substrates but would also allow a chemically purged environment, heated large-area substrates with an acceptable temperature uniformity, as well as by gaseous and/or mechanical means via facile mechanisms to apply relatively large and uniform pressures (e.g., up to 7000 psi, 500 bar, etc., but within the fracture limit of the substrate) to the wafers/substrates. It is noted that in some examples, atmospheric pressure can be utilized.

For example, an arising need for such a large-area apparatus is in the emerging field of atomically-thin two-dimensional (2D) materials, particularly graphene or MLG. Such graphene/MLG layers are preferred materials in several BEOL applications, particularly on-chip interconnects. However, BEOL interconnects must be effectively synthesized and doped under a strict thermal budget of <450° C. to avoid any damage to the underlying active devices (e.g. transistors, diodes, etc. via increased diffusion of impurities). Thus, the addition of pressure manipulation is important to achieving the doping at these relatively lower temperatures in an acceptable time scale for high-volume manufacturing environments.

The herein described apparatus and doping techniques are also extendable to a wide range of substrates of different materials (such as glass), geometries (such as square) and configurations (such as multi-level) and to other applications that inherently require a low thermal budget (<450° C.).

SUMMARY

In one aspect, an intercalation doping apparatus which facilitates the insertion of dopant atoms, ions, or molecules into layered 2D materials, the apparatus comprising: a reactor chamber, wherein single or multiple wafers or substrates are disposed within said reactor chamber, wherein pressure is applied to at least one surface of said single or multiple wafers or substrates within a range of 2 bar to 500 bar, and wherein said single or multiple wafers or substrates have a diameter or a side distance of 25 mm to 450 mm; a heater, wherein said heater applies heat to said single or multiple wafers or substrates, and wherein said single or multiple wafers or substrates comprise a temperature of 25° C. to 500° C.; and a dopant application apparatus, wherein said dopant application apparatus comprises at least valves and tubing which bring dopants from outside to within said reactor chamber, wherein said dopant application apparatus comprises at least a dopant crucible disposed within said reactor chamber, wherein said dopants comprise material in solid, liquid, or gaseous phase, and wherein said dopants comprise intercalation doping agents.

In another aspect, an intercalation doping apparatus which facilitates the insertion of dopant atoms, ions, or molecules into layered 2D materials, the apparatus comprising: a reactor chamber, wherein single or multiple wafers or substrates are disposed within said reactor chamber, wherein pressure is applied to at least one surface of said single or multiple wafers or substrates within a range of 2 bar to 500 bar, and wherein said single or multiple wafers or substrates have a diameter or a side distance of 25 mm to 450 mm; a heater, wherein said heater applies heat to said single or multiple wafers or substrates, and wherein said single or multiple wafers or substrates comprise a temperature of 25° C. to 500° C.; and a dopant application apparatus, wherein said dopant application apparatus comprises at least valves and tubing which bring dopants from outside to within said reactor chamber, wherein said dopant application apparatus comprises at least a dopant crucible disposed within said reactor chamber, wherein said dopants comprise material in solid, liquid, or gaseous phase, and wherein said dopants comprise intercalation doping agents, and wherein said single or multiple wafers or substrates comprise single layer, few-layer, or multi-layer graphene strips.

In another aspect, a method of intercalation doping, where said intercalation doping comprises an apparatus which facilitates the insertion of dopant atoms, ions, or molecules into layered 2D materials, said method comprising: providing a reactor chamber, a heater, and a dopant application apparatus; providing single or multiple wafers or substrates, wherein said single or multiple wafers or substrates are disposed within said reactor chamber, wherein said single or multiple wafers or substrates have a diameter or a side distance of 25 mm to 450 mm; applying heat to said single or multiple wafers or substrates via said heater, wherein said single or multiple wafers or substrates comprise a temperature of 25° C. to 500° C., applying pressure to at least one surface of said single or multiple wafers or substrates within a range of 2 bar to 500 bar; wherein said dopant application apparatus brings into and/or hosts dopants within said reactor chamber, wherein said dopants comprise material in solid, liquid, or gaseous phase, wherein said dopants comprise intercalation doping agents, wherein said single or multiple wafers or substrates comprise single layer, few-layer, or multi-layer graphene strips; and processing said single or multiple wafers or substrates at said temperature and said pressure in the presence of at least one of said intercalation doping agents.

BRIEF DESCRIPTION OF THE DRAWINGS

The present application can be best understood by reference to the following description taken in conjunction with the accompanying figures, in which like parts may be referred to by like numerals.

Figure 1A:
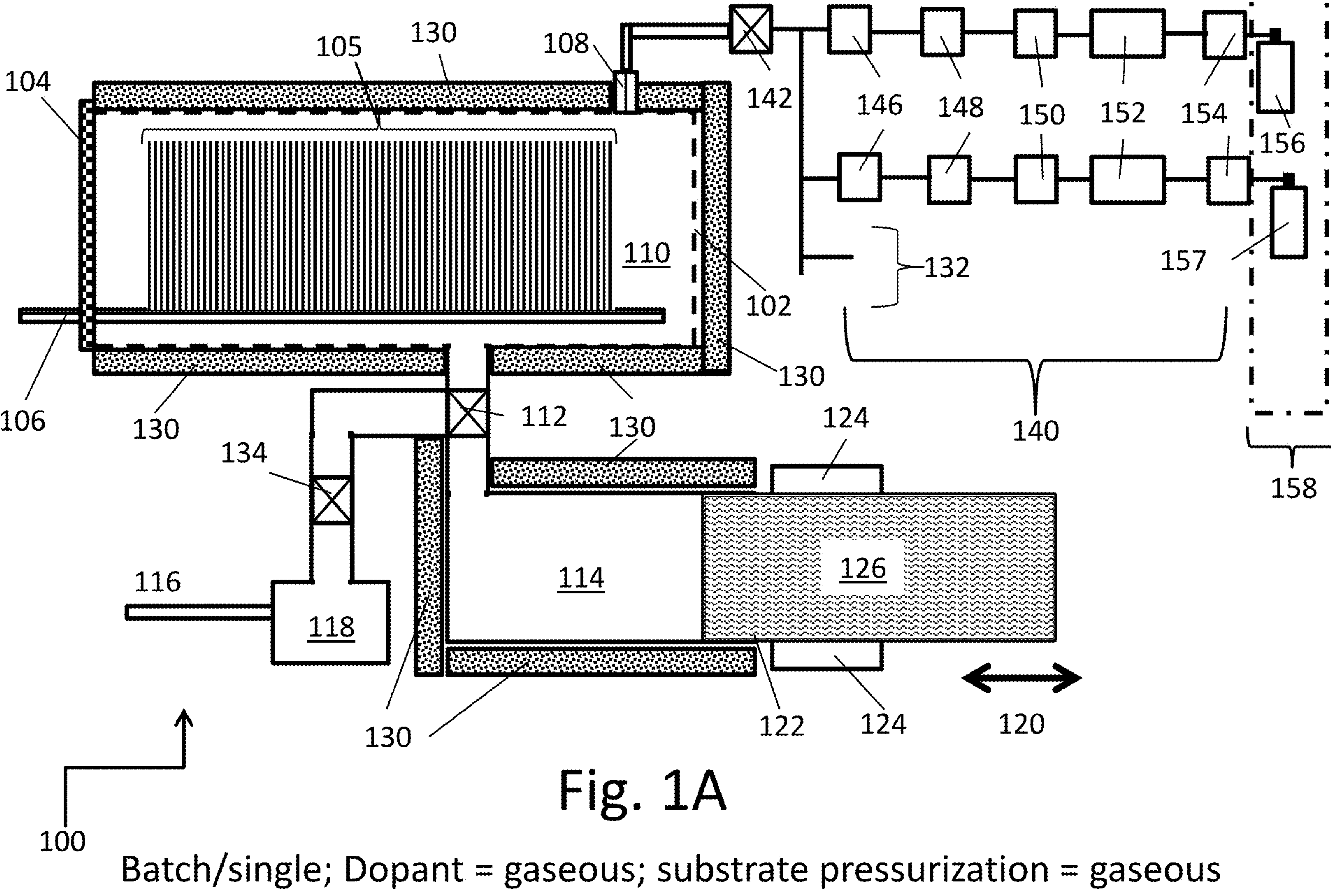
FIG. 1A illustrates an example batch/single-wafer process apparatus, which is capable of insertion of gaseous phase dopant atoms or molecules into single layer, few-layer, or multi-layer graphene (MLG) or any other layered or un-layered materials synthesized via any method and having any arbitrary geometry and thickness employing a gaseous pressurization of the wafers.

The Figures described above are a representative set and are not exhaustive with respect to embodying the invention.

DESCRIPTION

Disclosed are a system, method, and article of manufacture for various low-temperature/BEOL-compatible highly scalable doping tools which are configured to allow effective doping of difficult to dope materials. An example of a difficult to dope material, which is becoming the preferred choice for the scaling of microelectronic interconnects, is single and multiple layers of high quality graphene. The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments.

Reference throughout this specification to "one embodiment," "an embodiment," "one example," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Back-End-Of-Line (BEOL) is the second portion of IC fabrication where interconnects and other circuit elements are formed between and over the individual devices (primarily the transistors) on the wafer (e.g., the metallization layers) separated by intra-layer and/or inter-layer insulators.

Complementary metal-oxide-semiconductor (CMOS) is a type of metal-oxide-semiconductor field-effect transistor (MOSFET) fabrication process that uses complementary and many times electrically symmetrical pairs of p-type and n-type MOSFETs for implementing at least logic functions.

Grain boundary (GB) is the interface between two grains and/or crystallites in a polycrystalline material.

Graphene is an allotrope of carbon consisting of a single layer of atoms arranged in a two-dimensional honeycomb lattice.

Graphene nanoribbons (GNRs) are strips of graphene with a width less than about one-hundred (100) nm.

Graphite is a layered crystalline form of the element carbon with its atoms arranged and covalently bonded forming a hexagonal structure within the layers.

Intercalation doping: Intercalation is when a molecule or ion inserts reversibly between the layers of a compound (such as potassium ions between graphite layers). Doping is adding impurities into a material. The dopant (impurity ion) will incorporate into the material's lattice. N-type dopants will donate electrons to the material. P-type dopants will accept electrons from the material. This will change the charge carrier density and consequently the electronic properties of the material.

Intercalation doping agents: There are many in the literature. Specific to graphene is recent work by Kaustav Banerjee, et al.; for example, J. Jiang, Jae Hwan Chu, and Kaustav Banerjee, "CMOS-Compatible Doped-Multilayer-Graphene Interconnects for Next-Generation VLSI," IEDM 2018, pp. 799-802, 34.5.1-4; and J. Jiang, et al., "Intercalation doped multilayer-graphene-nanoribbons for next-generation interconnects," *Nano Letters*, vol. 17, no. 3, pp. 1482-1488, 2017.

Piezoelectricity is the electric charge that accumulates in certain solid materials in response to applied mechanical stress.

Resistance temperature detectors (RTDs) are sensors used to measure temperature by monitoring the change in the electrical resistance of a conductor with temperature. RTD elements can consist of a length of fine wire wrapped around a heat-resistant ceramic or glass core but other constructions are also used.

Silicon dioxide is an oxide of silicon and an insulator with the chemical formula $SiO_2$.

Wafer is a thin slice of semiconductor (e.g., a crystalline silicon, germanium) used for the fabrication of integrated circuits, etc.

Example Large-Area/Wafer-Scale Low-Temperature/BEOL-Compatible Highly Scalable Doping Tool: Batch/Single; Dopant=Gaseous; Substrate Pressurization=Gaseous It is noted that the following example embodiments discuss doping materials by way of example. However, other doping apparatuses or methods can be utilized in other example embodiments.

As illustrated in at least FIGS. 1A, 1B, 2, 3, and 4 various example apparatuses and approaches to insertion of dopant atoms or molecules in solid/liquid (vaporized to gas or not), or gaseous phase into single layer, few-layer, or multi-layer graphene (MLG) or any other layered materials synthesized via any method and having arbitrary geometry and thickness. FIG. 1A illustrates an example batch (although a single wafer/substrate could be run in the apparatus) doping apparatus schematic and an example process. By example, the doping of graphene/MLG may be described, for example, by gas phase doping with pressure and temperature acceleration, especially, but not limited to, the intercalation doping of MLG. This process and equipment is not limited to only intercalation doping of MLG, rather, many other materials may be doped by this apparatus using other methods.

As illustrated in FIG. 1A, a batch process apparatus 100 may include, and is not limited to, at least: reactor chamber 102, reactor chamber door and seal 104, substrates/wafers 105, paddle 106, dopant process gas/mist inlet 108, volume of full reactor process chamber 110, multi-direction high-pressure valve 112, piston chamber volume 114, pump purge & pressure gas 116, pressurization/exhaust pump 118, piston movement axis 120, piston chamber 122, solenoid or screw motor 124, piston 126, chambers sidewall heaters 130, extra setup for gasses 3 & 4 if required 132, pump to chamber valve 134, gas panel 140, dopant gas mixing block 142, MFC (mass flow controller) iso valve-output 146, MFC (Mass Flow Controller) 148, MFC iso valve—input 150, gas regulator 152, particle filter 154, dopant 1 gas cylinder 156, dopant 2 gas cylinder 157, and cleanroom gas service facility 158.

Reactor chamber 102 may include both an encasing steel pressure vessel, capable to withstand the pressures and temperatures applied, as well as a tube-like liner which may use a material, for example, such as high-quality high purity quartz. Reactor chamber 102 may include openings, such as reactor chamber door and seal 104, dopant process gas/mist inlet 108 (which may be integrated with a high-pressure shutoff valve), and opening(s) for the pressurization equipment thru multi-direction high-pressure valve 112. Reactor chamber door and seal 104 may be opened (after reactor chamber 102 is evacuated of toxic gases and then brought to atmospheric pressure), substrates/wafers 105 may be loaded onto paddle 106, which may include quartz 'boats' (not shown) with slots to hold the substrates/wafers 105 into a desirable position—usually parallel with a spacing determined by uniformity thru engineering calculations and considerations. However, there are many alternatives of how to hold substrates and wafers and process them. In this example FIG. 1, the Batch process apparatus 100 is drawn in a horizontal configuration. An alternative, Batch process apparatus 100 could be rotated 90 degrees and become a vertical high pressure process chamber. Reactor chamber 102 may include a system to mix input gases and/or provide for movement and exhaust of process gases (not shown), which may be located on an alternate end from where the gas input is located.

Paddle 106, reactor chamber door and seal 104, and substrates/wafers 105 may be moved into reactor chamber 102 until reactor chamber door and seal 104 is closed and sealed. Movement of paddle 106 and loading of substrates/wafers 105 onto the boats and then onto paddle 106 may be performed by robotic machines (not shown) to at least minimize defect generation (such as quartz dust) and human labor. Thus substrates/wafers 105 are now fully within reactor chamber 102. The temperature of at least substrates/wafers 105 may be equilibrated. Dopant gasses and/or mix of a single or multiple types of gaseous mixtures suitable for doping the substrates/wafers 105 may be introduced into reactor chamber 102 via different MFCs. Note these gasses may be heated or may be at about room temperature (so to provide for at least partial of the desired pressurization from a fixed volume and gases being heated) and may also be at a high pressure or place reactor chamber 102 interior volume of full reactor process chamber 110 at part or all of the desired high pressure. Pressure adjustments may be performed by moving multi-direction high-pressure valve 112 into a desired position and utilizing pressurization pump 118 (with pressurization gas thru pump purge & pressure gas 116) with pump to chamber valve 134 open. Alternatively, or in combination, the desired pressure may be attained by utilizing piston 126 moved by solenoid or screw motor 124 in direction piston movement axis 120 to change the volume (reducing V will increase P for a given T) and thus adjust the pressure of interior volume of full reactor process chamber 110. The pressure of the doping gasses in interior volume of full reactor process chamber 110 will accelerate the probability of dopant atoms injecting into the surfaces and sidewalls of structures (such as interconnect lines for example) of substrates/wafers 105.

Acceleration of dopant atoms impinging onto the surfaces of substrates/wafers 105 and resultant solid state diffusion rate thru a portion of substrates/wafers 105 may also be accelerated/increased by raising the temperature of substrates/wafers 105 and dopant gasses applied thru dopant process gas/mix inlet 108 into interior volume of full reactor process chamber 110 via at least chambers sidewall heaters 130. Note: the dopant gasses injected into the interior volume of full reactor process chamber 110 thru dopant process gas/mist inlet 108 may also be preheated or cooled if desirable by engineering & chemistry calculations and considerations. The temperature range of the interior volume of full reactor process chamber 110; and at equilibrium at least substrates/wafers 105, may be about 25° C. to about 500° C. with less than a ±5° C. uniformity. Interior volume of full reactor process chamber 110 may be designed to accommodate substrates/wafers 105 up to at least 450 mm in diameter if a round wafer or 450 mm per side if square/rectangle substrate. The pressure range of the interior volume of full reactor process chamber 110 may be about 20 psi, about 30 psi, about 40 psi, about 50 psi, about 60 psi, about 70 psi, about 80 psi, about 90 psi, about 100 psi, about 110 psi, about 120 psi, about 130 psi, about 150 psi, about 200 psi, about 250 psi, about 300 psi, about 350 psi, about 400 psi, about 450 psi, and could be greater than about 500 psi, or from 1-500 bar depending on engineering and design objectives, choices and considerations.

The gas pressure acceleration of dopant movement may be accomplished in at least four ways: 1) By the heating of the gas in the fixed volume of at least reactor process chamber 110; 2. By adding additional gas molecules into the fixed volume of at least reactor process chamber 110; 3. By decreasing the total volume of reactor process chamber 110 and piston chamber volume 114 (the 'piston style'); and 4. By utilizing pressurization/exhaust pump 118 to pump in a gas thru/from pump purge & pressure gas 116, thus increasing the pressure within at least reactor process chamber 110.

The supply of dopants into the interior volume of full reactor process chamber 110 may include gas panel 140 and cleanroom gas service facility 158. Although gaseous dopant delivery is shown in FIG. 1, liquid dopants may be delivered to the interior volume of full reactor process chamber 110 by at least the method of bubbling a carrier gas, for example, such as $N_2$, Ar and the like (non-reactive) or may include reactive carrier gasses, for example $O_2$, thru a liquid dopant, for example, $POCl_3$ and the like. A typical gas panel may include sets of MFC iso valve—output 146, MFC (Mass Flow Controller) 148, MFC iso valve-input 150, gas regulator 152, and particle filter 154. Each 'line' of these components may be supplied with a dopant gas each from the dopant 1 gas cylinder 156 and dopant 2 gas cylinder 157 respectively which may reside in cleanroom gas service facility 158. Extra setup for gasses 3 & 4 if required 132 may include liquid dopants, as well as solid dopants (such as heating a powder to release a dopant metal and then an inert carrier gas may 'carry' the dopant infused gas) to dopant gas mixing block 142 and ultimately dopant process gas/mist inlet 108 into interior volume of full reactor process chamber 110.

For the example of materials being used in the specification the doping process may proceed as follows. Substrates/wafers 105 are loaded onto paddle 106 and then all moved and loaded into reactor chamber 102 and interior volume of full reactor process chamber 110. Substrates/wafers 105 have had the MLG interconnect layers patterned via lithography as required; the MLG is etched such that the MLG sidewalls are exposed for intercalation doping. The dopant gas may be run to fill the interior volume of full reactor process chamber 110, for example, such as, for example $PH_3$ and $O_2$, and the reactor chamber temperature has been equilibrated at approximately 400° C., for example. Pressure may be brought to the appropriate pressure for the interconnect line size of the MLG on substrates/wafers 105. The pressure of interior volume of full reactor process chamber 110 may be held for times of $10^{-60}$ minutes typically, or even longer, again depending on engineering calculation and considerations, to dope the MLG lines of various geometries to the desired sheet resistance. The pressure is reduced and the tube is purged of dopant and reactive gases, then paddle 106 may be safely removed from the reactor chamber 102, and substrates/wafers 105 may be removed for further processing.

Figure 1B:
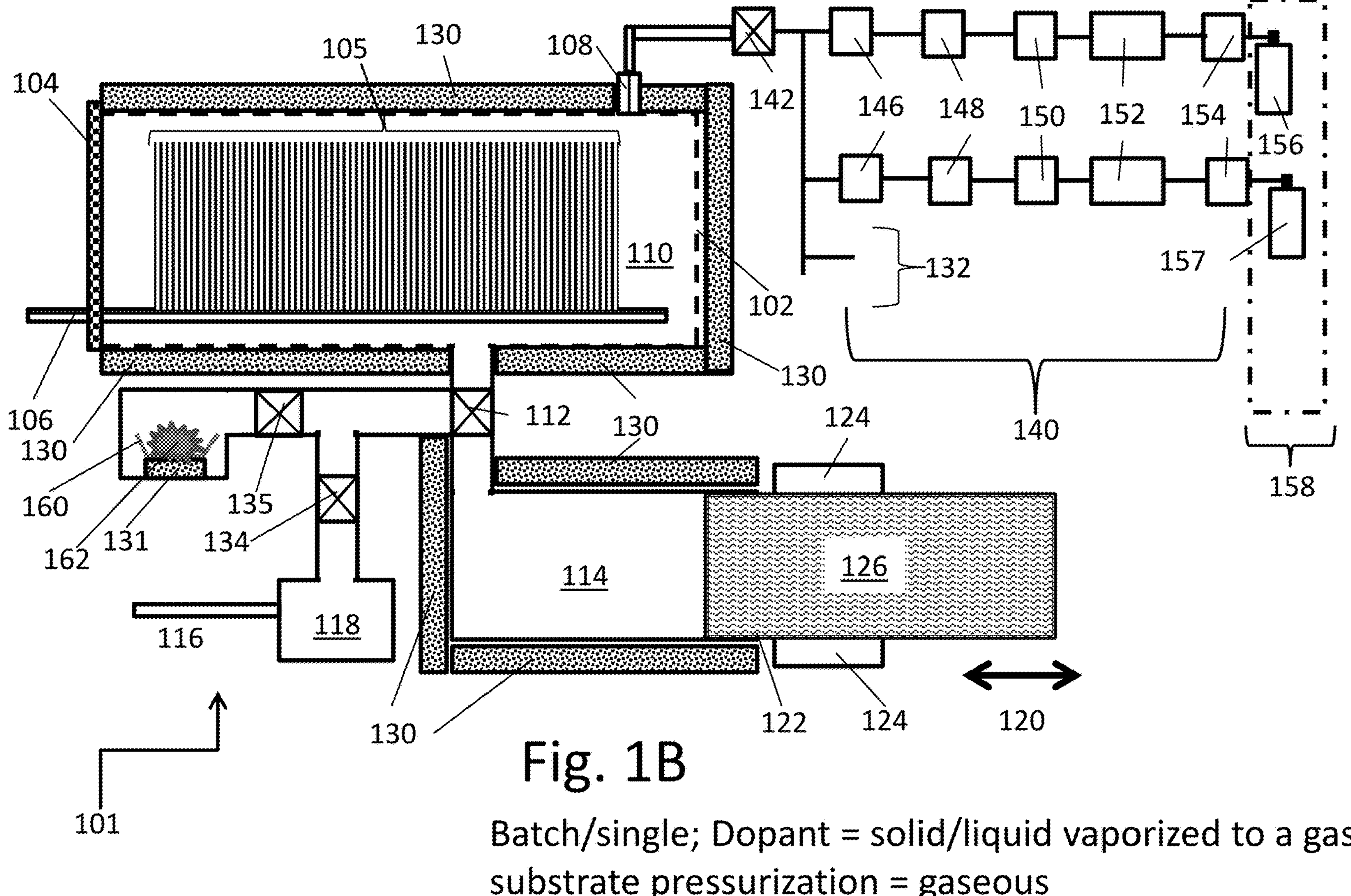
FIG. 1B illustrates an example apparatus schematic view of a similar apparatus as FIG. 1A with the additional capability of employing a solid/liquid dopant vaporized to gas along with a gaseous pressurization of the substrates/wafers, according to some embodiments.

Another Example Large-Area/Wafer-Scale Low-Temperature/BEOL-Compatible Highly Scalable Doping Tool: Batch/Single; Dopant=Solid/Liquid Vaporized to a Gas; Substrate Pressurization=Gaseous FIG. 1B illustrates an example batch (although a single wafer/substrate could be run in the apparatus) doping apparatus schematic and an example process. FIG. 1B and the embodiments therein have aspects of FIG. 1A embodiments within. By example, the doping of graphene/MLG may be described, for example, by solid/liquid (vaporized to gas) phase doping with gaseous pressure and temperature acceleration, especially, but not limited to, the intercalation doping of MLG. This process and equipment are not limited to only intercalation doping of MLG, rather, many other materials may be doped by this apparatus using other methods.

As illustrated in FIG. 1B, a batch (although a single substrate/wafer may be processed) process apparatus 101 may include, and is not limited to, at least: reactor chamber 102 (dashed line segments), reactor chamber door and seal 104, substrates/wafers 105, paddle 106, dopant process gas/mist inlet 108, volume of full reactor process chamber 110, multi-direction high-pressure valve 112, piston chamber volume 114, pump purge & pressure gas 116, pressurization/exhaust pump 118, piston movement axis 120, piston chamber 122, solenoid or screw motor 124, piston 126, chambers sidewall heaters 130, temperature control for solid sources 131, extra setup for gasses 3 & 4 if required 132, pump to chamber valve 134, solid source to chamber valve 135, gas panel 140, dopant gas mixing block 142, MFC iso valve-output 146, MFC (Mass Flow Controller) 148, MFC iso valve-input 150, gas regulator 152, particle filter 154, dopant 1 gas cylinder 156, dopant 2 gas cylinder 157, cleanroom gas service facility 158, solid source crucible 160, and solid/slurry/liquid source material 162.

Reactor chamber 102 may include both an encasing steel pressure vessel, capable to withstand the pressures and temperatures applied, as well as a tube-like liner which may use a material, for example, such as high-quality high purity quartz. Reactor chamber 102 may include openings, such as reactor chamber door and seal 104, dopant process gas/mist inlet 108 (which may be integrated with a high-pressure shutoff valve), and opening(s) for the pressurization equipment (and one potential placement for the solid/slurry/liquid source material 162 thru solid source to chamber valve 135) thru multi-direction high-pressure valve 112. Reactor chamber door and seal 104 may be opened (after reactor chamber 102 is evacuated of toxic/reactive gases and then brought to atmospheric pressure), substrates/wafers 105 may be loaded onto paddle 106, which may include quartz 'boats' (not shown) with slots to hold the substrates/wafers 105 into a desirable position—usually parallel with a spacing determined by uniformity requirements thru engineering calculations and considerations.

However, there are many alternatives of how to hold substrates and wafers and process them. In this example FIG. 1B, the batch process apparatus 100 is drawn in a horizontal configuration. As an alternative additional embodiment, batch process apparatus 100 could be rotated 90 degrees in z and become a vertical high pressure process chamber. Reactor chamber 102 may include a system to mix input gases (perhaps dopant gas mixing block 142) and/or provide for movement and exhaust of process gases (not shown) during operation (and purge gases when in idle or door open situations), which may be located on an alternate end from where the gas input is located. Dopant process gas/mist inlet 108 may have many alternative configurations, for example, such as a showerhead, a quartz injector, heated or cooled gas tubing, due to engineering and chemistry considerations and choices.

Paddle 106, reactor chamber door and seal 104, and substrates/wafers 105 may be moved into reactor chamber 102 until reactor chamber door and seal 104 is closed and sealed. Manual and/or automatic latches, cogs, and so on (not shown) may be utilized to provide a strong enough mechanical seal of reactor chamber door and seal 104 such that reactor chamber 102 pressure may be maintained, as well as for safe operation. Movement of paddle 106 and loading of substrates/wafers 105 onto the boats and then onto paddle 106 may be performed by robotic machines (not shown) to at least minimize defect generation (such as quartz dust) and human labor. Thus substrates/wafers 105 are now fully within reactor chamber 102. The temperature of at least substrates/wafers 105 may be equilibrated.

Dopant gasses and/or mix of a single or multiple types of gaseous mixtures including liquids suitable for doping the substrates/wafers 105 may be introduced into reactor chamber 102 via different MFCs. Note these gasses may be heated or may be at about room temperature (so to provide for at least partial of the desired pressurization from a fixed volume and gases being heated) and may also be at a high pressure or place reactor chamber 102 interior volume of full reactor process chamber 110 at part or all of the desired high pressure. Pressure adjustments may be performed by moving multi-direction high-pressure valve 112 into a desired position and utilizing pressurization pump 118 (with pressurization gas thru pump purge & pressure gas 116) with pump to chamber valve 134 open. Alternatively, or in combination, the desired pressure may be attained by utilizing piston 126 moved by solenoid or screw motor 124 in the direction of piston movement axis 120 to change the total volume (reducing V will increase P for a given T) and thus adjust the pressure of interior volume of at least full reactor process chamber 110.

The pressure of the doping gasses in the interior volume of full reactor process chamber 110 will accelerate the probability of dopant atoms injecting into the surfaces and sidewalls of structures (such as interconnect lines for example) of substrates/wafers 105 as well as with the source coming from a solid or liquid in contact with the top structures of substrates/wafers 105. For example, a doped SOG (P-SOG, B-SOG, BP-SOG, and so on) may be applied to substrates/wafers 105 prior to the T and P acceleration of tool process apparatus 101. For example, a solid layer saturated or thereabouts with the desired dopant atoms may be deposited on substrates/wafers 105 before being processed in process apparatus 101. As well, the formation of a doped layer at least covering substrates/wafers 105 may be part of the process within process apparatus 101; for example, such as bubbling a carrier gas through $POCl_3$ plus an $O_2$ gas run in reactor chamber 102 for forming a deposited Phosphorous doped glass (a PSG) deposited onto substrates/wafers 105 and the interior surfaces of reactor chamber 102. Furthermore, a solid dopant; for example, such as an Arsenic or $FeCl_3$ powder or slurry, as solid/slurry/liquid source material 162, may be placed into solid source crucible 160 and then appropriately heated by temperature control for solid sources 131 to out-gas and thus provide a solid source doping thru gaseous means with temperature and pressure acceleration. Solid/slurry/liquid source material 162 may be placed within reactor chamber 102 as an option, but separate temperature control of solid/slurry/liquid source material 162 is thus lost. As a note, significant pressure may be obtained by merely heating the gases within the fixed volume of a closed/isolated reactor chamber 102.

Acceleration of dopant atoms impinging onto the surfaces of substrates/wafers 105 and resultant solid state diffusion rate thru a portion of substrates/wafers 105 may also be accelerated/increased by raising the temperature of substrates/wafers 105 and dopant gasses. These may be applied thru dopant process gas/mix inlet 108 into the interior volume of full reactor process chamber 110 heated by at least chambers sidewall heaters 130. Note: the dopant gasses injected into interior volume of full reactor process chamber 110 thru dopant process gas/mist inlet 108 may also be preheated or cooled if desirable by engineering & chemistry calculations and considerations. The temperature range of the interior volume of full reactor process chamber 110; and at equilibrium at least substrates/wafers 105, may be about 25° C. to about 500° C. with less than a ±5° C. uniformity. Interior volume of full reactor process chamber 110 may be designed to accommodate substrates/wafers 105 up to at least 450 mm in diameter if a round wafer or 450 mm per side if square/rectangle substrate. The tool process apparatus 101 may be modified to accommodate substrates in a continuous format. The pressure range of the interior volume of full reactor process chamber 110 may be about 20 psi, about 30 psi, about 40 psi, about 50 psi, about 60 psi, about 70 psi, about 80 psi, about 90 psi, about 100 psi, about 110 psi, about 120 psi, about 130 psi, about 150 psi, about 200 psi, about 250 psi, about 300 psi, about 350 psi, about 400 psi, about 450 psi, and could be greater than about 500 psi, or from 1-500 bar depending on engineering and design objectives, choices and considerations.

The supply of gases and material dopants which may form solids/liquids (glasses are just viscous liquids) as dopants into the interior volume of full reactor process chamber 110 may include gas panel 140 and cleanroom gas service facility 158. Although a gaseous dopant delivery is shown in FIG. 1B, liquid dopants may be delivered to interior volume of full reactor process chamber 110 by at least the method of bubbling a carrier gas, for example, such as $N_2$, Ar and the like (non-reactive) or may include reactive carrier gasses, for example $O_2$, thru a liquid dopant, for example, $POCl_3$ and the like. A typical gas panel may include sets of MFC iso valve-output 146, MFC (Mass Flow Controller) 148, MFC iso valve-input 150, gas regulator 152, and particle filter 154. Each 'line' of these components may be supplied with a dopant gas each from the exemplary dopant 1 gas cylinder 156 and exemplary dopant 2 gas cylinder 157 respectively which may reside in cleanroom gas service facility 158. Extra setup for gasses 3 & 4, if required 132, may additionally include liquid dopants, as well as solid dopants (such as heating a powder to release a dopant metal and then an inert carrier gas may 'carry' the dopant infused gas) to dopant gas mixing block 142 and ultimately thru dopant process gas/mist inlet 108 into the interior volume of full reactor process chamber 110.

As an example of materials being used herein, forming MLG and then performing intercalation doping, the doping process may proceed as follows. Substrates/wafers 105 are loaded onto paddle 106 and then all moved and loaded into reactor chamber 102 and interior volume of full reactor process chamber 110. Substrates/wafers 105 have had the MLG interconnect layers patterned via lithography as required; the MLG is etched such that the MLG sidewalls are exposed for intercalation doping. The dopant gas may be run to fill the interior volume of full reactor process chamber 110, for example, such as, for example $PH_3$ and $O_2$, and may be configured to form a doped glass and the reactor chamber temperature has been equilibrated at approximately 400° C., for example. Pressure may be brought to the appropriate pressure for the interconnect line size of the MLG on substrates/wafers 105. (See the 'at least 4 ways' of increasing pressure in a paragraph prior herein.) The pressure of the interior volume of full reactor process chamber 110 may be held for times of $10^{-60}$ minutes typically, or even longer, again depending on engineering calculation and considerations, to dope the MLG lines of various geometries to the desired sheet resistance. The pressure is reduced and the tube is evacuated/purged of dopant and reactive gases, then paddle 106 may be removed from the reactor chamber 102, and substrates/wafers 105 may be removed for further processing.

Figure 2:
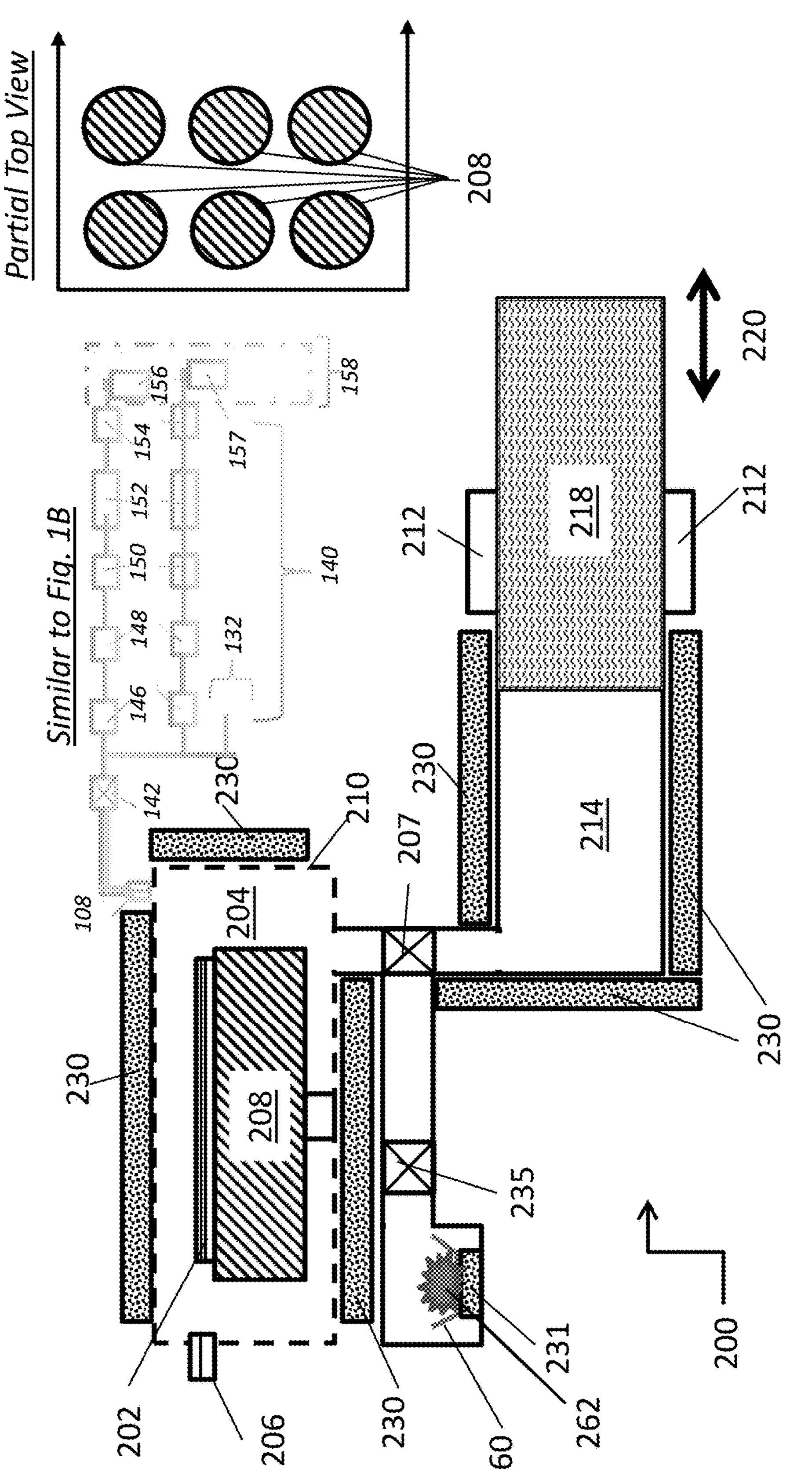
FIG. 2 illustrates a second example apparatus schematic view and process, which introduces gases into a reactor chamber and pressurizes the dopant (gas or liquid/solid vaporized to gas) by gaseous pressurization for the purposes of doping the horizontally placed single or multiple wafer(s)/substrate(s), according to some embodiments.

Another Example Large-Area/Wafer-Scale Low-Temperature/BEOL-Compatible Highly Scalable Doping Tool: Platen-Single/Multi; Dopant=Solid/Liquid Vaporized to a Gas; Substrate Pressurization=Gaseous FIG. 2 illustrates an example schematic view of an embodiment of a touchless pressure system utilizing a piston style generation of gaseous pressure with a solid/liquid dopant (vaporized to gas) and a horizontal single or multi wafer/substrate platen. Example piston style gaseous pressure generation system 200 may include, but is not limited to, substrate/wafer 202, slit 206, process chamber volume 204, heated bottom disk 208, valve 207, piston 218, minimum volume process chamber 210, solenoid or screw motor 212, piston volume 214, piston movement axis 220, chambers sidewall heaters 230, temperature control for solid sources 231, solid source to chamber valve 235, solid source crucible 260, and solid source material 262. Example piston style gaseous pressure generation system 200 may also include the gas system drawn in shadow small blue, taken from and may be similar to FIG. 1B.

Example piston style gaseous pressure generation system 200 utilizes the combined gas law to allow the machine operator, usually through software control means, to manipulate volume and temperature to affect the pressure applied onto the top surface of substrate/wafer 202, which can accelerate a dopant atom or molecule diffuse thru the desired to be doped material, for example, graphene, such as monolayer or few-layer graphene structures, or multi-layer graphene (MLG) structures. Doping graphene layers may be from the sidewalls of the graphene lines or ribbon structures to provide for a more efficient and effective doping primarily thru intercalation doping.

Substrate/wafer 202, as described in more detail herein, may enter into minimum volume process chamber 210 thru slit 206 and be placed on top of heated bottom disk 208. Heat control of the wafer and the gasses may be performed by at least heated bottom disk 208 and various chambers sidewall heaters 230, chosen by engineering choice and considerations/tradeoffs. Alternative methods of heating the gas and the wafer may include, for example, such as, heat lamps, and so on. Heated bottom disk 208 may include a rotational function to allow improved uniformity in temperature for thermal processes, which may include doping processes, use of intercalation agents, and some film formation processes. This rotational function of heated bottom disk 208 may be combined with most any of the touchless pressure functions to provide diffusion acceleration of diffusion pairs and doping processes such as intercalation doping. Process chamber and reactor chamber may be used interchangeably herein this disclosure.

Pressure on the top of substrate/wafer 202 may be controlled by the piston system (as well as the increased pressure as gasses heat up in a fixed volume) shown in FIG. 2. Process chamber volume 204 plus piston volume 214 may be modified from its initial volume (204+214) to a final volume (204+214-vol of piston 218 insertion) by moving piston 218 via solenoid or screw motor 212 in piston movement axis 220 directions. This would modify the total volume with no size expansion of the container walls, thus raising the Pressure of process chamber volume 204 and piston volume 214.

Another example operation of process chamber 210 is now described. A clean and dry substrate/wafer 202 may be placed on heated bottom disk 208 thru slit 206. A small vacuum pump (not shown), may bring the process chamber 204 to 100-300 mtorr and heated bottom disk 208 can bring the substrate/wafer 202 to about 200° C. to dry the wafer, The vacuum pump (not shown) may also be used to keep wafer/substrate 202 firmly on heated bottom disk 208, and may assist in the substrate/wafer 202 dehydration process. Substrate/wafer 202 may have a dopant layer already deposited on it, or piston style gaseous pressure generation system 200 can be configured to deposit a doped layer, such as, for example, $POCl_3$ doped $SiO_2$. These are described in detail in at least the FIG. 1B description herein. Now gaseous pressure may be used in addition to temperature to accelerate the movement of dopant atoms from the doping layer of wafer 202 thru the material to be doped, for example, monocrystalline silicon or MLG. Time at temperature and applied gaseous pressure may be controlled to bring the desired dopant movement. As described in at least FIG. 1A herein, the dopant supply to the surfaces of substrate/wafer 202 may be sourced from gasses injected (not shown in FIG. 2, but is in FIG. 1) into the reactor chamber 210. The gasses may be pressurized and/or the reactor chamber may be pressurized to increase the probability of dopant atoms being on the substrate/wafer 202 surface and being injected into and diffuse into the top structures, regions, or layers of wafer/substrate 202 as desired. Note: Heated bottom disk 208 may be configured as a multi-wafer/substrate holder, for example, such as a wafer platen, so to process more than one wafer simultaneously and thus increase productivity of the tool (see Partial Top View breakout schematic).

Figure 2A:
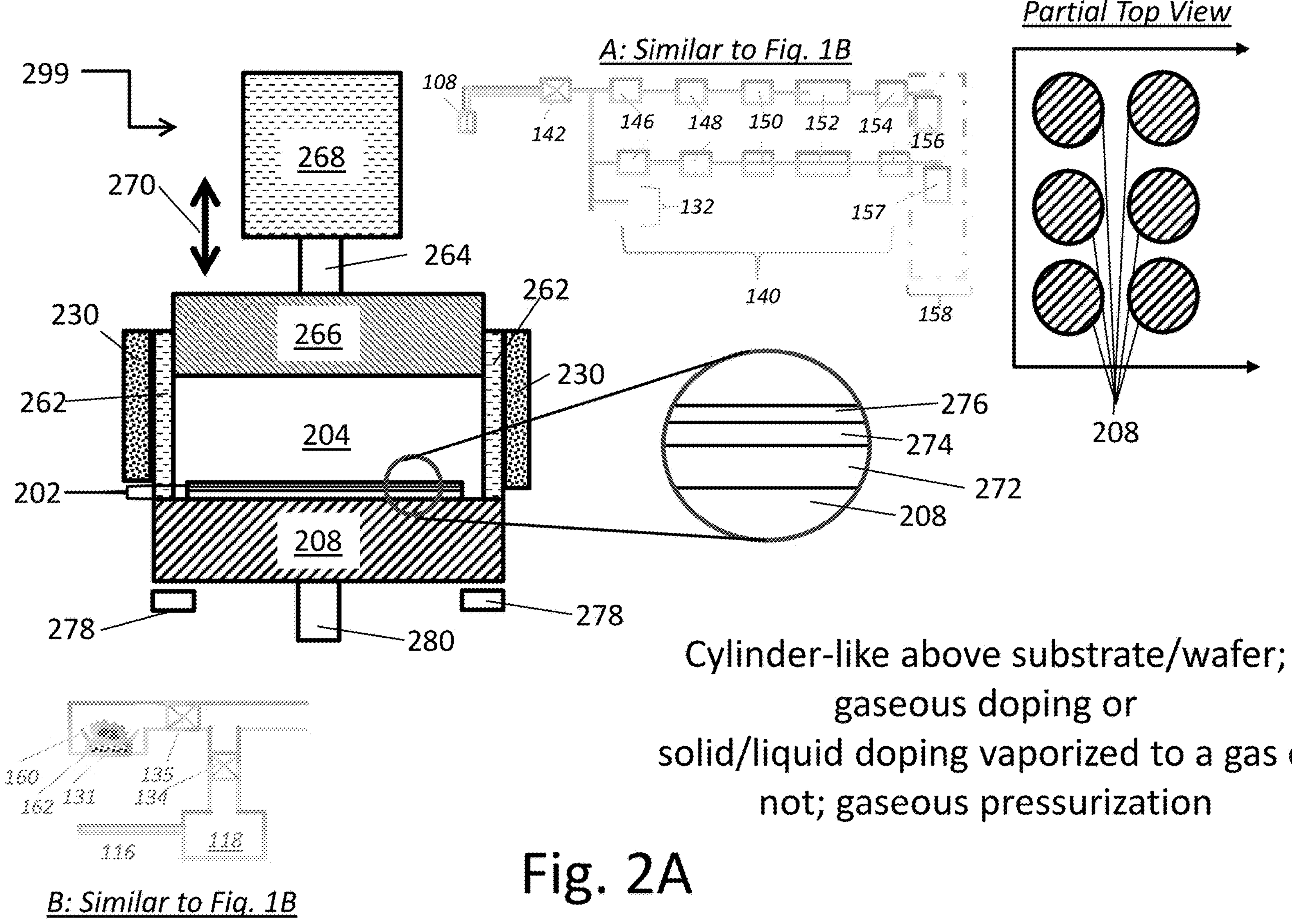
FIG. 2A illustrates a third example apparatus schematic of a process/reactor chamber within the apparatus of at least FIG. 2 with a no-touch pressurization acceleration of doping by a piston over the horizontally placed substrate(s)/wafer(s) in addition to various other means, according to some embodiments.

In addition, another embodiment of the invention includes an orientation of the pressurization cylinder piston volume 214 and moving piston 218 as vertical rather than horizontal as example illustrated in FIG. 2. Additionally, the pressurization cylinder piston volume 214 and moving piston 218 may be placed directly above each wafer/substrate 202 and heated bottom disk 208, similar in respect to a large internal combustion engine cylinder in, for example, a 6-cylinder automobile engine. As illustrated in FIG. 2A, an example schematic view of an embodiment of one such touchless pressure system utilizing a piston-cylinder above substrate/wafer generation of gaseous pressure with a gas/solid/liquid dopant and a single or multi wafer/substrate platen, illustrates a portion of the entire tool. The embodiments of FIG. 2A many include many embodiments of both FIG. 2 and FIG. 1B.

Example piston-cylinder style gaseous pressure generation system 299 may include, but is not limited to, substrate/wafer 202, slit 206 (see FIG. 2), process chamber/reactor interior volume 204, heated bottom disk 208, valve 207 (see FIG. 2), piston 266, solenoid or screw motor 268, piston 266 to motor 268 shaft 264, piston movement direction 270, process chamber sidewalls 262, chamber sidewall heaters 230 (see FIG. 2), heated bottom disk 208 shaft 280, heated bottom disk 208 support structures 278, solid vaporization structures 235, 231, 260, 262 (see FIG. 2), primary substrate/wafer 272, dopant layer 276 (optional), exemplary structures to be doped 274 (or substrate of interest such as glass, etc.), and substrate (typically silicon) 272. As well, example piston-cylinder style gaseous pressure generation system 299 may also include the gas system drawn in shadow small blue, taken from and may be similar to FIG. 1B; and similarly, the pump and solid/slurry/liquid dopant source section drawn in shadow small blue, taken from and may be similar to FIG. 1B.

Optional (if configured for solid/liquid doping) dopant layer 276 may be formed by depositing a highly doped layer which is used as a dopant source, for example, such as in a diffusion tube (such as $POCl_3$), thru a doped CVD or PECVD process. Additionally, optional dopant layer 276 may be formed by depositing a thin layer of an oxide and doping the oxide via a PLAD process or traditional ion implantation. Furthermore, optional dopant layer 276 may include a spin-on layer of doped glass (d-SOG), or other organic materials, which may be baked and outgassed before application of pressure, or may not be and thus left ‘soft’. Exemplary structures to be doped 274 may include MLG interconnect structures after etch & clean, so that the MLG edges are exposed to optional dopant layer 276 or bare exposed structures exposed to process chamber/reactor interior volume 204. Note: FIG. 2A is only showing the process reactor/chamber portion of the tool/apparatus, and may be combined with portions of FIG. 2 to show a substantially complete tool high-level schematic.

A typical process flow utilizing the tool of FIG. 2A+FIG. 2 may include the following: substrate/wafer 202 may be placed/loaded onto heated bottom disk 208 with pins up (not shown) thru slit 206. The pins may be retracted and substrate/wafer 202 backside primary substrate/wafer 272 is firmly contacted to heated bottom disk 208. At least the process chamber sidewalls 262 and piston 266 are retracted up so to not impede the loading of substrate/wafer 202. At least the process chamber sidewalls 262*s* are now placed down to contact heated bottom disk 208 and seal. (This seal may be made less critical by having a pressure chamber surround much of the example piston-cylinder style gaseous pressure generation system 299.) A gap between process chamber sidewalls 262 and heated bottom disk 208 may be left during a doping layer deposition step. Process chamber/reactor interior volume 204 may be purged, evacuated and repeated if determined by engineering data and choices. Heated bottom disk 208 and chamber sidewall heaters 230 may bring the substrate/wafer 202 to the desired temperature. Piston 266 may be moved by solenoid or screw motor 268 thru piston 266 to motor 268 shaft 264 to make the volume of process chamber/reactor interior volume 204 smaller, thus increasing the gas pressure within process chamber/reactor interior volume 204 and on the top surface of optional dopant layer 276 or the top surface of exemplary structures to be doped 274 for direct gaseous doping. The position of piston 266 may be adjusted to obtain the desired pressure of process chamber/reactor interior volume 204 and the top surfaces of either exemplary structures to be doped 274 or optional dopant layer 276. This may be held, or modulated by varying the applied pressure by vibrating or moving piston 266 to accomplish the desired pressure (and temperature) acceleration of the doping of exemplary structures to be doped 274.

Figure 3:
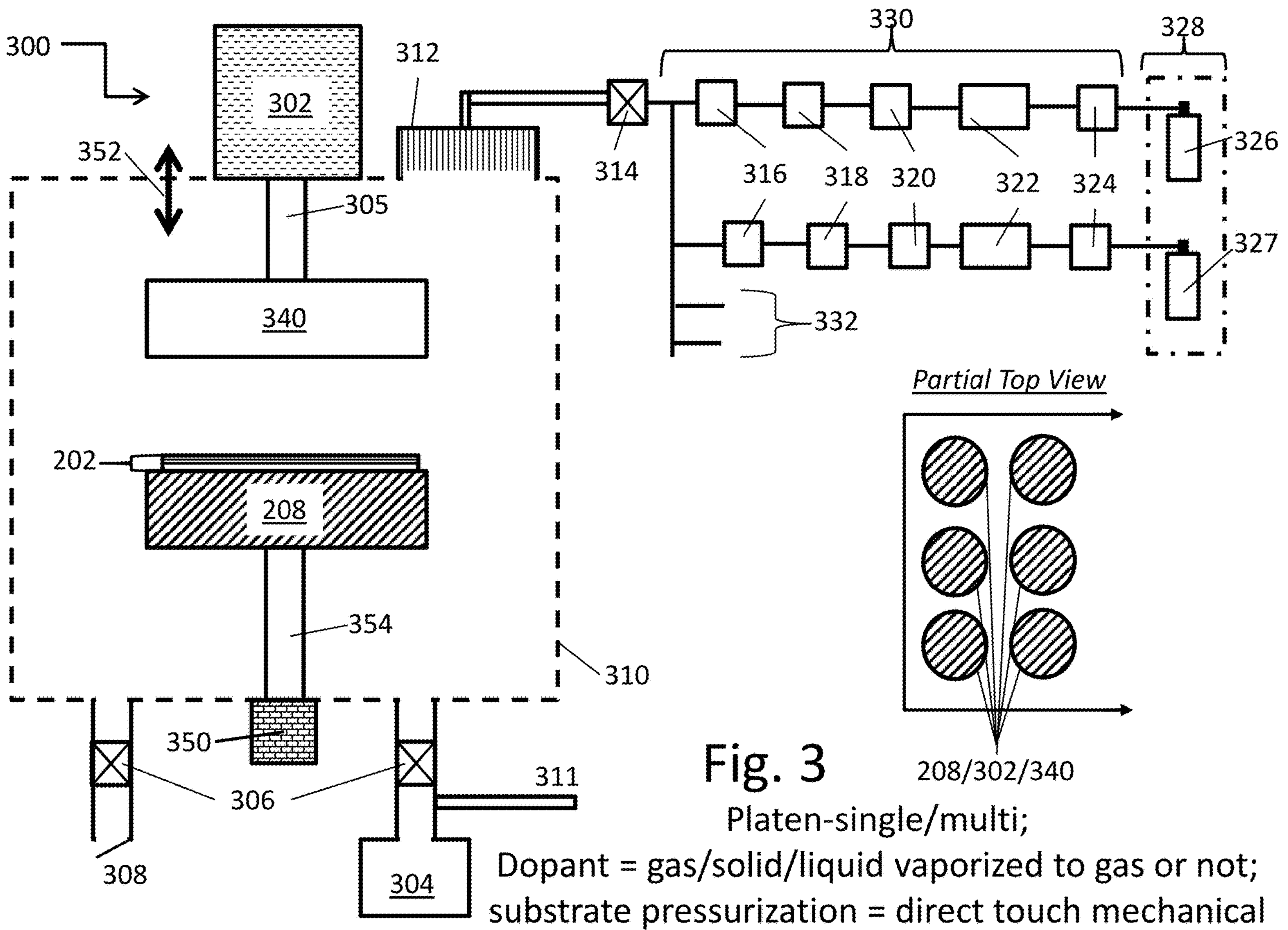
FIG. 3 illustrates a fourth example apparatus schematic with a direct touch mechanical pressurization of the gaseous or solid/liquid dopant source (vaporized to gas or not), according to some embodiments.

Another Example Large-Area/Wafer-Scale Low-Temperature/BEOL-Compatible Highly Scalable Doping Tool: Platen-Single/Multi; Dopant=Gas/Solid/Liquid Vaporized to Gas or not; Substrate Pressurization=Direct Touch Mechanical FIG. 3 illustrates an example batch (although a single wafer/substrate might be run in the apparatus) doping apparatus schematic and an example process which introduces gasses into process chamber 310 for the purposes of doping example substrate/wafer 202 and uses mechanical pressure and temperature to accelerate the doping process. The mechanical pressure in this example tool/apparatus 300 is by direct touch mechanical pressure. Example substrate/wafer 202 may include many materials in many kinds of configurations, ready to be doped; however, the example being used is a substrate/wafer 202 as a monocrystalline silicon wafer with formed thick oxide structures with openings etched to the silicon. In-situ doping tool/apparatus 300 may include, and is not limited to, at least: heated top disk 340, heated bottom disk 208, process or reactor chamber 310, substrate/wafer 202 including silicon with oxide structures on the top layer, motor 302, mechanical/turbo pump 304, motor 302 to top disk 340 shaft 305, control valves 306, exhaust 308, purge 311, bottom heating power supply 350, bottom heating power supply 350 to heated bottom disk 208 shaft 354, gas showerhead 312, dopant gas mixing block 314, MFC iso valve-output 316, MFC (Mass Flow Controller) 318, MFC iso valve-input 320, gas regulator 322, particle filter 324, dopant 1 gas cylinder 326, dopant 2 gas cylinder 327, cleanroom gas service facility 328, gas panel 330, and extra setup for gasses 3 & 4 if required 332. This example apparatus and process includes introducing carrier gases with dopants into the chamber at suitable pressures so as to permit diffusion/migration of the dopants into the silicon with oxide structures. This could be accomplished directly in the disclosed process chamber with top and bottom heated disks; or in another one of the chamber embodiments described herein. If plasma is required to enhance the process, then electrodes can be provided in each disk to accomplish the purpose or a remote/downstream plasma source may be considered. This aforementioned approach could be done in other chamber embodiments discussed in this application (e.g., Pressurized batch chamber, at least FIG. 1 herein).

For example, by the addition of dopant insertion into the topmost monocrystalline silicon surface through physical contact with a solid dopant material (as was done previously in the industry with boron disks in contact with Si for boron doping). Here too a solid dopant disk (similar in function to optional dopant layer 276) may be brought into, for example, the chamber with top and bottom heaters, after a wafer with monocrystalline silicon and oxide structures is brought in. The solid dopant disk could be placed on top of the monocrystalline silicon and oxide structures formed wafer. The top heater disk would then first gently, then ramp up to the desired pressure so to push the doped disk against the substrate/wafer 202 front (top) face. The level of pressure would be set to a value that optimizes diffusion of the dopant. Heater and electric fields (not shown) could be applied as needed to facilitate the process. As shown in at least FIG. 2A and associated specification sections herein, substrate/wafer 202, if liquid or solid types of dopant sources are desired to be utilized, may include at least dopant layer 276 (optional), exemplary structures to be doped 274 (or substrate of interest such as glass, etc.), and substrate (typically silicon) 272.

Pressure on the substrate/wafer 202 may be mechanically accomplished by pressing heated top disk 340 onto the top of solid dopant disk, which is on top of the structures desired to be doped, for example, the exemplary MLG interconnect structures discussed herein, and the current example of monocrystalline silicon and oxide structures thus forcing dopant into device monocrystalline silicon and oxide structures and regions. High temperature as described above may also be applied to help induce doping of a desired monocrystalline silicon and oxide structures and regions. This process may be subject to strict surface cleaning requirements and may be subject to a greater defectivity than more modern doping processes disclosed herein. Solid dopant disk may include a layer of relatively softer doped material, for example, a PECVD BPSG or PSG, or a doped SOG (Spin-On-Glass) layer, which is soft enough to be pressed from pressure applied by, for example, heated top disk 340 into the spaces between substrate/wafer 202 exposed interconnect lines containing, for example, molecularly aligned materials such as MLG, so to promote some intercalation doping from/thru the sidewalls of MLG interconnect lines.

Example Embodiments

Other configurations of the reactor which apply other forms of heat and/or pressure on the substrate are now discussed. It is noted that the aforementioned configuration is just one of many. Alternate configurations could include, inter alia:

- Heated membrane subject to high pressure (either pneumatic or hydraulic for example);
- Clamshell configurations with high temperature and high pressure heated N2, Ar, other such gases;
- Large batch reactors with the same characteristics as discussed supra;
- Clamshell in which combinations of the previously detailed approaches to heating and applying pressure to the substrates may be used. For example, high temperature and pressure gas could be fed in; high pressure could be fed in with the bottom heater being used to heat the substrate, bottom heater heats high temperature gas to accomplish the pressure function and maintain temperature, and so on;
- Quartz body with substrate placed on a susceptor and inductively heated and pressure loading accomplished using high pressure gas; and
- May also include an array of lamps in a quartz body for final temp control.

The following sections provide certain ranges of operation for the system, as well as parameter ranges for desired material structures, composition, and the like for optimal process results.

It is noted that the reactor can be implemented as a batch reactor and/or single substrate (wafer) reactor. It is noted that in single substrate configurations finer substrate to substrate process control than with a batch reactor can be accomplished. A method of creating a batch process with a single wafer architecture may also be realized by employing a stack of wafers between the two heaters.

Alternative Doping Methods

Another disclosed apparatus system may also be used to introduce dopants into the wafer and structures on/in the wafers since the chamber infrastructure permits such an operation. The literature lists out at least six methods of carrier doping of materials: 1) boron- or nitrogen substitutional doping; 2) deposition of alkali metal atoms; 3) adsorption of gasses such as $NO_2$; 4) charge transfer from conjugated organic molecules; 5) liquid phase interaction of graphene and dopant molecules; and 6) spin coating for example, of TCNQ and PMMA mixture. The literature references for the doping list above may include at least Hans He, et al.; "Uniform doping of graphene close to the Dirac point by polymer-assisted assembly of molecular dopants", *Nature Communications,* 27 Sep. 2018, pp. 1-7.; and V. Narendar, et al., "First Principle Study of Doped Graphene for FET Applications", *Silicon* vol. 11, pp. 277-

286 (2019); and R. Ishikawa, et al., "Doping graphene films via chemically mediated charge transfer," Nanoscale Research Letters, vol. 6, pp. 111-116 (2011); the entirety of all of the forgoing are incorporated by reference. Intercalation doping is described in at least W. Liu, J. Kang and K. Banerjee, "Characterization of $FeCl_3$ Intercalation Doped CVD Few-Layer Graphene," IEEE Electron Device Letters, Vol. 37, No. 9, pp. 1246-1249, September 2016; and J. Jiang, J. H. Chu, and K. Banerjee, "CMOS-compatible doped-multilayer-graphene interconnects for next-generation VLSI," IEEE IEDM, 2018, pp: 34.5.1-34.5.4; the entire contents of the forgoing are incorporated by reference. Many of these may not be practical for certain types of doing challenges, for example, charge transfer by surface adsorption doping.

Intercalation doping applications generally require access to the 'edge' of the layered structure, as doping directly thru the tight matrix of layered atoms is very difficult. Thus, the desired lithographic and etch processing desired for that specific interconnect layer using layered materials, for example, such as graphene/MLG, may be performed. The wafer may then be cleaned and a layer of dopant source may be deposited, either in a separate machine or within the process chamber of the apparatus described herein. Then the disclosed apparatus may be used to drive the dopant into the exposed MLG sidewalls utilizing the temperature and pressure capability of the apparatus described herein. The wafer may then be removed from the process chamber and the dopant layer may be selectively removed, or in some applications, may remain on the wafer as a capping layer to mitigate out diffusion of dopant from the MLG lines.

The apparatuses described in at least FIGS. 1-3 may include a Transfer Chamber to load the substrate/wafer X02 into the reactor/process chamber and may be utilized to pre-process a substrate/wafer X02 prior to the wafer being moved from a transfer chamber to a reactor/process chamber. A pre-process of the substrate/wafer X02 may include rotational and/or translational movement of the wafer to fix alignment of, for example, the 'notch' or 'flat' or some other substrate (wafer) crystallographic orientation indicator to align the wafer into a constant or variable position before transfer into reactor/process chamber. A pre-process of the wafer may include heating of the wafer to perhaps dry the wafer of water moisture and/or prepare the wafer's temperature such that the warming may shorten or enhance the process performed in the reactor/process chamber. A pre-process of the wafer may include purging of a transfer chamber with either an inert gas, for example, such as $N_2$, Ar, He, and so on; or a reactive gas, such as, for example, $O_2$, $O_3$, and so on. A pre-process of the wafer may include various exposures to the electromagnetic spectrum, for example, such as UV, X-ray, IR, which may be utilized to bring specific atoms active or pushed into excited states, for example, such as an RTA (Rapid Thermal Anneal) or an RTO (Rapid Thermal Oxide). A pre-process of the wafer may include plasma exposures to the wafer, for example, to clean the wafer surface, or chemically activate portions of the wafer surface for other processing (such as growing an oxide, making a surface of the wafer inactive, and so on).

Various combinations and sub-combinations of at least the above disclosed pre-processing options may be performed to, for example, create a pre-process such as heating the wafer and exposing the wafer to UV light with an $O_2$ or $O_3$ purge/atmosphere (oxidizing. reducing atmospheres may be useful too, especially for wafer cleaning) in order to create a thin oxide on some or all of the surfaces of the wafer, and so on.

The 'substrate/wafer' may include various sizes (e.g., diameter of, for example, such as about 450 mm, about 400 mm, about 300 mm, about 200 mm, about 150 mm, etc.). A substrate/wafer may include other overall (ignoring notches, flats, etc.) shapes, when viewed from above the substrate/wafer, for example, a circle, a square, a rectangle, and so on. The substrate/wafer composition may include for example, materials such as, crystalline substances such as elemental Silicon, Germanium, Aluminum, Copper alloys, SiGe, aluminum, h-BN, various glasses (amorphous or crystalline), amorphous forms of Si, Ge, and so on. The substrate/wafer composition may include, for example, multiple materials such as, SOI (Silicon-On-Insulator), GeOI, and so on. An operator/user/robot can place a wafer/substrate into a transfer chamber. A machine can be configured to do this loading in an automated manner, including use of wafer containers such as FOUP, and so on.

The reactor/process chamber and the transfer chamber may be connected via a slit structure. The machine control software may be configured to have the slit automatically open once the pressures inside the two chambers are equalized. A hard-wired backup control system with redundant pressure transducers may be included in the apparatus to ensure safe transfers of wafers only when the pressures are equal between reactor/process chamber & transfer chamber.

The reactor/process chamber may be the main chamber (or reactor) for growth or deposition of various layers, for example, such as doping layers, on the wafer in addition to the acceleration of dopant diffusion purposes. However, growth of many materials, for example, graphene (and/or other carbon material), requires a dedicated chamber due to contamination and particle issues. A slightly larger than 450 mm sized substrate may be located in the reactor/process chamber. The reactor/process chamber may be equipped with a heater system to heat the reactor/process chamber interior walls to enable not just the process requirements, but also to engender easier or less often cleaning maintenance. Depending on process details, gases used, and other engineering considerations, reactor/process chamber interior walls may also include a cooling system, to suppress bypass deposition of process gas reactions, thus enabling longer chamber cleaning maintenance cycles and suppression of in-situ process & film defects from deposition of particles from the interior walls falling on the wafer or blown onto the wafer from process gas flows.

A heated top plate or disk may be located in the reactor/process chamber as well (e.g., see heated top disk 340). Heated top disk 340 and/or heated bottom disk 208 may include its own heating mechanism (e.g., heating power supply 350 shown for bottom disk 208). In this way, both the lower disk on which the wafer is placed and the heated top disk can be heated independently and have separate temperature control via the machine software. For example, the lower disk can be heated and the top can be kept at approximately room temperature (or vice versa). Heated top disk and/or heated bottom disk may be configured to include independently controllable zones on the disk; for example, such as, concentric rings of different temperature control, pizza-like slices as zones of temperature control, and so on. Combinations of the above may also be configured.

The liner surfaces (covering the disks: for example, heated top disk 340 and/or heated bottom disk 208, and reactor/process chamber 310 interior walls) can be made of graphite, though other materials such as aluminum nitride, quartz, silicon carbide coated graphite, etc. may be employed. Several such materials are possible—generally speaking materials which permit good heat transfer and distribution of pressure can be considered. Particle formation may also be influenced by surface finish, adhesion of deposited film(s), thermal expansion coefficients, and so on. Reactor/Process chamber 310 and other described herein may include the capability to ignite plasma, for example using $NF_3$ & Ar, and so on, to provide an in-situ interior chamber surfaces cleaning procedure, which may help minimize particulate contamination of the wafer surface or formation of embedded film defects, and thus lengthen chamber maintenance cycles.

Mechanical/turbo pump 304 can be used to control pressure in reactor/process chamber 310 and/or transfer chamber (not shown). Mechanical pump(s) can be used to lower pressure in reactor/process chamber (e.g., $10^{-3}$ torr). The turbo pump can be a more powerful pump that is used to lower the pressure even further (e.g., $10^{-7}$ torr). Low pressure is desired to purge the chamber of any impurities during portions of the operation cycle.

Heating power supply 350 can heat and control the temperature on the heated bottom disk 208. This can be done with a ±5° C. uniformity (and/or near-zero non-uniformity) across the heated bottom disk 208. Heated top disk 340 and heated bottom disk 208 may each include multiple thermocouples or alternative temperature sensing devices embedded within each disk to provide temperature inputs to a temperature control system, for example, such as a proportional feedback control system, and so on. Heated bottom disk 208 can generate the heat via current resistance from the heating power supply 212, or may be water heated for some temperature ranges (not shown), or may be heated by light lamp sources (not shown) placed inside reactor/process chamber 310 so to alight at least heated bottom disk 208.

Heated top disk 340 can move up and down along an axis 352, which is perpendicular to the bottom area surface of heated top disk 340 and to the top area surface of heated bottom disk 208. Heated top disk 340 may have an independent heating supply. Heated top disk 340 can be operated to produce a mechanical pressure on the substrate/wafer with; for example, such as shaft 305, a motor, a screw jack movement, and the like. Gaseous pressure may also be utilized in addition to or in replacement of mechanical pressure. The objective of the applied pressure is to enable a higher dopant diffusion rate within either a top layer of dopant in the substrate/wafer 202, or higher dopant diffusion rates into the base material of substrate/wafer 202, for example, such as monocrystalline silicon, $SiO_2$ as glass (as a network modifier) and so on.

See at least patent applications 63/123,587 and PCT/US21/61361 and at least papers J. Jiang, et al., "Intercalation doped multilayer-graphene-nanoribbons for next generation interconnect," *Nano Letters,* 17(3), pp. 1482-1488, 2017; and J. Jiang, et al., "All-carbon interconnect scheme integrating graphene wires and carbon-nanotube-vias," *IEEE IEDM*, pp. 14.3.1-14.3.4, 2017; and J. Jiang, et al., "CMOS-Compatible Doped-Multilayer-Graphene Interconnects for Next-Generation VLSI," *IEEE IEDM*, pp. 34.5.1-34.5.4, 2018; and K. Agashiwala, et al., "Reliability and Performance of CMOS-Compatible Multi-Level Graphene Interconnects Incorporating Vias" *IEEE IEDM,* 2020; and K. Agashiwala, et al., "Demonstration of CMOS-Compatible Multi-Level Graphene Interconnects with Metal Vias" *IEEE Transactions on Electron Devices*, vol. 68, No. 4, April 2021, pp. 2063-2091; the entirety of all of the forgoing are incorporated by reference.

Heated top disk 340 can be moved such to provide mechanical pressure on the substrate/wafer 202 as it sits on heated bottom disk 208. By way of example, this mechanical pressure can be about 20 psi, about 30 psi, about 40 psi, about 50 psi, about 60 psi, about 70 psi, about 80 psi, about 90 psi, about 100 psi, about 110 psi, about 120 psi, about 130 psi, about 150 psi, about 200 psi, about 250 psi, about 300 psi, about 350 psi, about 400 psi, about 450 psi, and could be greater than about 500 psi, or from 1-500 bar. While the heated top disk 340 applies mechanical pressure to the top surface of substrate/wafer 202, the reactor/process chamber 310 pressure may be maintained at a low value. The reactor/process chamber 310 pressure can be for example, $10^{-6}$ to $10^{-7}$ torr to prevent contamination of the diffusion process. Reactor/process chamber 310 pressure can be regulated by at least mechanical/turbo pump 216.

Pressure applied to the diffusion at top surface of substrate/wafer 202 may also be generated by alternative means; for example, such as thru utilizing reactor/process chamber 310 (or another sub-chamber within) with pressure generated by high pressure gasses applied to the interior of reactor/process chamber 310. Another alternative might be a piston style generation of gaseous pressure, which may provide a lower particulate count within reactor/process chamber 310 and still be touchless to the wafer top surface.

It is noted that when substrate/wafer 202 has a temperature below ~450° C. then it can be compatible with a CMOS/BEOL thermal budget. BEOL are process steps are semiconductor integrated circuit formation steps that take place after front-end-of-line transistors are fabricated. Once a fabrication process has built the transistors on the wafer, the subsequent processing steps should be within the ~450° C. thermal budget to avoid damage to the transistors and various junctions that may lead to shorts and reliability issues. Not all applications of the tool described herein may be subject to this temperature restriction. For example, doping of junctions in monocrystalline silicon, dopant diffusion via spacer materials and so on are examples in semiconductor manufacturing where the temperature limit may be much higher, perhaps about 650° C., or 900° C. As well, processing with glass substrates may be accomplished, for example, in a tape and reel similar type layout and require temperatures higher the 450° C.

The reactor/process chamber pressure can be calibrated and monitored through the use of a pressure sensor which may be placed on the step of the pedestal, through monitoring of the current drawn by the motor applying the pressure between the surfaces, through use of flexures configured as strain gauges embedded in the liner material and the like. Likewise, the temperature can be monitored using thermocouples and RTDs mounted in the pedestals, use of IR sensors, phosphorus-based sensors, and laser spectrographic sensors for chemical and/or elemental determinations, and the like.

Conclusion

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

We claim:

1. A method of accelerated intercalation doping by insertion of dopant atoms, ions, or molecules into layered 2D materials, said method comprising:

loading single or multiple wafers or substrates into a reactor chamber, wherein the single or multiple wafers or substrates comprise a diameter or side distance in the range of 25 mm to 450 mm, wherein the single or multiple wafers or substrates comprise multi-layer graphene strips, wherein the multi-layer graphene strips comprise exposed layer edges, wherein the multi-layer graphene strips each comprise two or more graphene layers, wherein each of the graphene layers consists of a single layer of atoms;

heating the single or multiple wafers or substrates to a temperature of 25° C. to 500° C.;

creating pressure on the single or multiple wafers or substrates in the range of 2 bar to 500 bar; and introducing intercalation doping agents into the reactor chamber to insert the intercalation dopants between the two or more graphene layers via the exposed layer edges.

2. The method according to claim 1, wherein said introducing comprises accelerating atoms or molecules of the intercalation dopants via pressure, temperature or electrical bias.

3. The method according to claim 1, wherein said heating, creating and introducing are maintained for a specified time, and wherein said specified time is at least one half of a maximum width of the graphene strips divided by a speed of intercalation doping.

4. The method according to claim 1, wherein said creating creates the pressure via gaseous pressure.

5. The method according to claim 1, wherein said creating creates the pressure via mechanical pressure.

6. The method according to claim 1, wherein the single or multiple wafers or substrates comprise layered 2D materials.

7. The method according to claim 1, wherein said introducing is conducted via a dopant application apparatus.

8. The method according to claim 1, wherein a space between parallel ones of the exposed layer edges is equal to or greater than 10 times the diameter of a molecule, ion, or atom of said intercalant dopant.

9. The method according to claim 1, wherein said introducing comprises injecting dopant gas into the reactor chamber.

10. The method according to claim 1, wherein said introducing comprises hosting liquid or solid dopants in a crucible within the reactor chamber.

11. The method according to claim 1, wherein the reactor chamber is vertically oriented and the single or multiple wafers or substrates are horizontally oriented.

12. The method according to claim 1, said introducing comprises hosting liquid or solid dopants in a crucible in a separate chamber connected to the reactor chamber and heating the crucible to a different temperature than the single or multiple wafers or substrates.

13. The method according to claim 1, wherein the multi-layer graphene strips comprise one or more interconnect structures on the single or multiple wafers or substrates.

* * * * *